United States Patent
Tung

(10) Patent No.: US 12,470,173 B2
(45) Date of Patent: Nov. 11, 2025

(54) OSCILLATOR APPARATUS AND CONTROL METHOD

(71) Applicant: Diodes Incorporated, Plano, TX (US)

(72) Inventor: Yen-Chang Tung, HsinChu (TW)

(73) Assignee: Diodes Incorporated, Plano, TX (US)

( * ) Notice: Subject to any disclaimer, the term of this patent is extended or adjusted under 35 U.S.C. 154(b) by 0 days.

(21) Appl. No.: 18/626,280

(22) Filed: Apr. 3, 2024

(65) Prior Publication Data

US 2025/0317106 A1    Oct. 9, 2025

(51) Int. Cl.
| | |
|---|---|
| *H03B 5/24* | (2006.01) |
| *H03K 3/0231* | (2006.01) |
| *H03K 3/03* | (2006.01) |
| *H03L 7/099* | (2006.01) |

(52) U.S. Cl.
CPC ............. *H03B 5/24* (2013.01); *H03K 3/0231* (2013.01); *H03K 3/0315* (2013.01); *H03L 7/099* (2013.01)

(58) Field of Classification Search
CPC .......... H03B 5/20; H03B 5/24; H03K 3/0231; H03K 3/0315
USPC ........................................... 331/57, 111, 143
See application file for complete search history.

(56) References Cited

U.S. PATENT DOCUMENTS

| | | | | |
|---|---|---|---|---|
| 3,845,385 A * | 10/1974 | Ebrecht | ................ | H03K 3/0231 331/65 |
| 3,868,596 A * | 2/1975 | Williford | ............ | H04L 27/2025 332/100 |
| 3,878,484 A * | 4/1975 | Hekimian | .............. | H03K 4/066 327/131 |
| 4,344,293 A * | 8/1982 | Fujiwara | ............... | G01F 23/263 331/65 |
| 4,795,988 A * | 1/1989 | Britz | ........................ | H03B 5/20 331/135 |
| 5,180,991 A * | 1/1993 | Takashima | ................ | H03L 7/00 331/49 |
| 7,741,921 B2 * | 6/2010 | Ismailov | ................ | H03B 27/00 331/96 |
| 9,350,328 B1 * | 5/2016 | Trauth | .................... | H03K 3/014 |
| 10,826,501 B1 * | 11/2020 | Coban | ................... | H03L 7/0995 |
| 2008/0007355 A1 * | 1/2008 | Nakashima | .......... | H03K 3/0315 331/111 |
| 2013/0154749 A1 * | 6/2013 | Chen | ........................ | H03K 3/03 331/57 |
| 2015/0145609 A1 * | 5/2015 | Higuchi | .................... | H03K 3/03 331/66 |
| 2022/0173698 A1 * | 6/2022 | Oomori | .................... | H03B 5/20 |

* cited by examiner

*Primary Examiner* — Levi Gannon
(74) *Attorney, Agent, or Firm* — AP3 Law Firm PLLC

(57) ABSTRACT

An apparatus includes a first inverter having an input terminal and an output terminal, a first capacitive device connected between the input terminal and the output terminal of the first inverter, and a resistor network coupled to the first capacitive device, wherein the first inverter is configured as a negative amplifier, and the first capacitive device and the resistor network are configured to determine a frequency of an oscillator.

16 Claims, 11 Drawing Sheets

OSCILLATOR APPARATUS AND CONTROL METHOD

TECHNICAL FIELD

Embodiments of the invention relate to an oscillator, and, in particular embodiments, to a resistor-capacitor oscillator with a capacitor having an enlarged effective capacitance.

BACKGROUND

As semiconductor technologies evolve, oscillators have been widely used in various electronic devices. For example, oscillators are commonly used in processors (e.g., microcontrollers), mobile devices (e.g., mobile phones), audio devices (e.g., wireless headphones), computers (e.g., laptop computers), telecommunication devices (e.g., based stations) and the like.

FIG. 1 illustrates an oscillator. The oscillator comprises a first inverter 101, a second inverter 102, a third inverter 103, a fourth inverter 104, a capacitor C1, a resistor network 100, a first NAND gate 201, a second NAND gate 202 and a third NAND gate 203. The resistor network 100 comprises a plurality of switch-resistor networks (e.g., S1-R1, S2-R2, S3-R3 and S4-R4) connected in series between a first terminal of the resistor network 100 and a second terminal of the resistor network 100. Each first switch-resistor network comprises a resistor (e.g., R1) and a switch (e.g., S1) connected in parallel.

As shown in FIG. 1, the input terminal of the second inverter 102 is connected to the input terminal of the first inverter 101, and further connected to the first terminal of the resistor network 100 and a first terminal of the capacitor C1. A second terminal of the capacitor C1 is grounded. The output terminal of the second inverter 102 is connected to the input terminal of the third inverter 103. The output terminal of the third inverter 103 is connected to a first input terminal of the second NAND gate 202. The output terminal of the first inverter 101 is connected to a second input terminal of the first NAND gate 201. A first input terminal of the first NAND gate 201 is connected to an output terminal of the second NAND gate 202. A second input terminal of the second NAND gate 202 is connected to an output terminal of the first NAND gate 201. The output terminal of the first NAND gate 201 is connected to a first input terminal of the third NAND gate 203. A second input terminal of the third NAND gate 203 is configured to receive an enable signal EN. An output terminal of the third NAND gate 203 is connected to the second terminal of the resistor network 100. The input terminal of the fourth inverter 104 is connected to the output terminal of the first NAND gate 201. The output terminal OSCOUT of the fourth inverter 104 is configured to generate a periodic ac signal.

The oscillator shown in FIG. 1 is an RC oscillator. The periodic ac signal generated by the oscillator can be used as a clock signal, a timing signal and the like. In addition, the RC oscillator is able to generate a variable frequency by changing the resistance value of the resistor network 100 and/or the capacitance value of the capacitor C1. In order to attain a low operation frequency oscillator, a high value of RC is necessary. However, in integrated circuits, achieving a large RC requires a larger size. Thus, as a lower operation frequency is desired, a larger RC becomes essential, leading to increased costs.

The semiconductor industry has developed a manufacturing technology aimed at producing high-density capacitors with values several times greater than those of standard capacitors, resulting in smaller capacitor sizes. However, this new manufacturing technology requires a distinctive mask layout and complex manufacturing procedures, resulting in higher costs compared to standard semiconductor fabrication processes.

It would be desirable to have a capacitive device for use in low frequency oscillator applications exhibiting good characteristics such as a large capacitance value in a smaller capacitor size. The present disclosure addresses this need.

SUMMARY

These and other problems are generally solved or circumvented, and technical advantages are generally achieved, by preferred embodiments of the present disclosure which provide a resistor-capacitor oscillator with a capacitor having an enlarged effective capacitance.

In accordance with an embodiment, an apparatus comprises a first inverter having an input terminal and an output terminal, a first capacitive device connected between the input terminal and the output terminal of the first inverter, and a resistor network coupled to the first capacitive device, wherein the first inverter is configured as a negative amplifier, and the first capacitive device and the resistor network are configured to determine a frequency of an oscillator.

In accordance with another embodiment, a method comprises providing an oscillator comprising a first inverter, a first capacitive device connected between an input terminal and an output terminal of the first inverter, and a resistor network coupled to the first capacitive device, configuring the first inverter a negative amplifier to enlarge an effective capacitance of the first capacitive device, and adjusting a frequency of the oscillator through adjusting at least one of the effective capacitance of the first capacitive device and a resistance value of the resistor network.

In accordance with yet another embodiment, a system comprises a first inverter having an input terminal and an output terminal, a first capacitive device connected between the input terminal and the output terminal of the first inverter, a second inverter having an input terminal and an output terminal, a second capacitive device connected between the input terminal and the output terminal of the second inverter, and a resistor network connected to the input terminal of the first inverter and the input terminal of the second inverter, wherein the first capacitive device, the second capacitive device and the resistor network are configured to determine a frequency of an oscillator.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a resistor-capacitor oscillator with a capacitor having an enlarged effective capacitance. The disclosure may also be applied, however, to a variety of oscillators. Hereinafter, various embodiments will be explained in detail with reference to the accompanying drawings.

Figure 2:
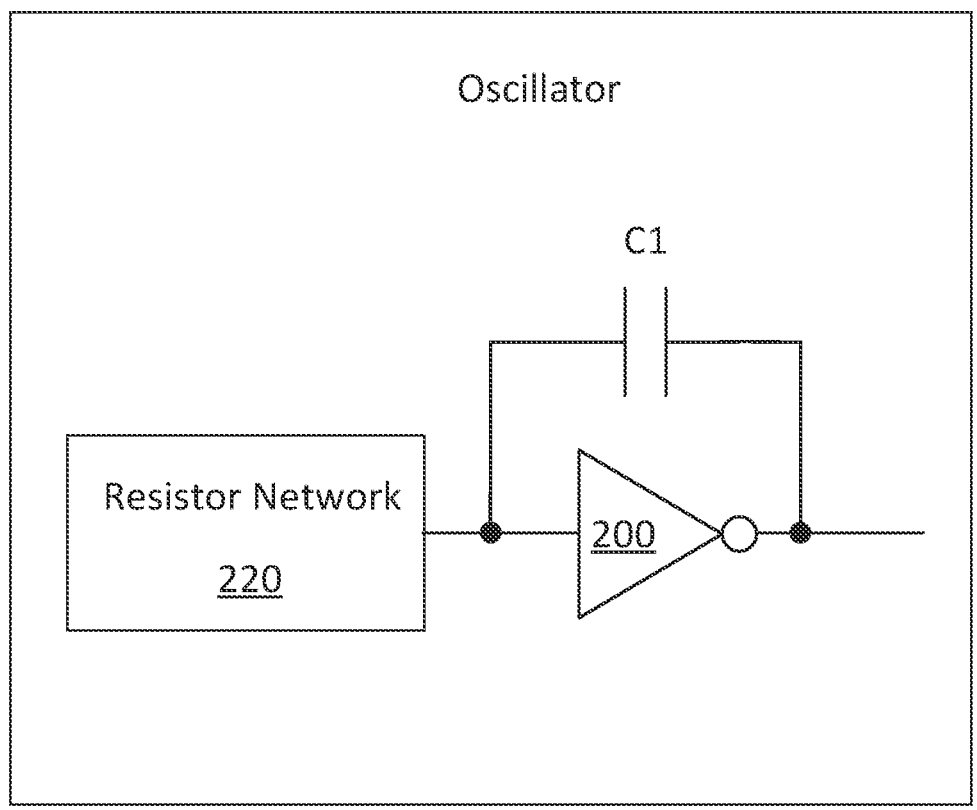
FIG. 2 illustrates a block diagram of a resistor-capacitor oscillator with a capacitor having an enlarged effective capacitance in accordance with various embodiments of the present disclosure.

FIG. 2 illustrates a block diagram of a resistor-capacitor (RC) oscillator with a capacitor having an enlarged effective capacitance in accordance with various embodiments of the present disclosure. The oscillator comprises an inverter 200, a capacitive device and a resistor network 220. In some embodiments, the capacitive device is implemented as a capacitor C1 as shown in FIG. 2. The inverter 200 has an input terminal and an output terminal. The capacitor C1 is connected between the input terminal and the output terminal of the inverter 200. The resistor network 220 is coupled to the capacitor C1 and the input terminal of the inverter 200.

In operation, the inverter 200 is configured as a negative amplifier. According to the Miller effect of the negative amplifier, the capacitance value of the capacitor on the input node of the negative amplifier can be expressed as:

$$Cin = C1 \times (1 + A) \qquad (1)$$

In Equation (1), A is the voltage gain of the negative amplifier. The capacitance value of the capacitor on the output node of the negative amplifier can be expressed as:

$$Cout = C1 \times \left(1 + \frac{1}{A}\right) \qquad (2)$$

In consideration with the large value of A, the capacitance value of the capacitor on the output node of the negative amplifier is approximately equal to the capacitance value of C1. As such, the total capacitance provided by C1 and the negative amplifier can be expressed as:

$$Ctotal = C1 \times (2 + A) \qquad (3)$$

Figure 1:
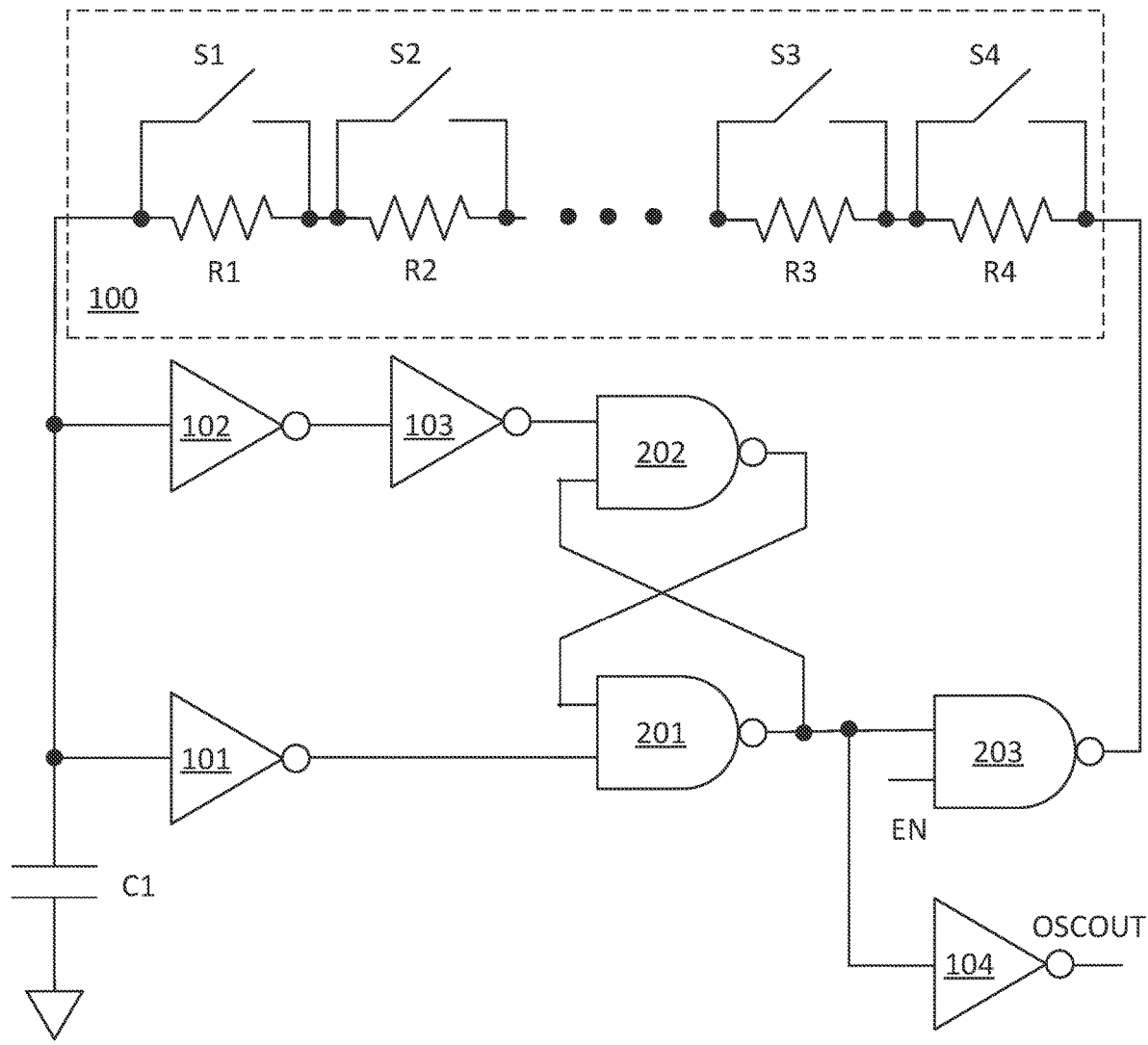
FIG. 1 illustrates an oscillator.

In some embodiments, the voltage gain A of the negative amplifier is in a range from about 8 to about 20. For example, when the voltage gain A is equal to eight, the total capacitance is equal to ten times the capacitance of the capacitor C1. In other words, a capacitor with a 10% capacity can achieve comparable performance in determining the frequency of the oscillator. The capacitor size is significantly smaller compared to the conventional RC oscillators (e.g., the RC oscillator shown in FIG. 1), approximately under 90% of their size.

One advantageous feature of having the capacitor C1 connected between the input and output terminals of the inverter 200 is that the capacitance-increasing technology shown in FIG. 2 does not increase power consumption. In addition, the capacitance-increasing technology shown in FIG. 2 does not require any specialized semiconductor fabrication processes.

In operation, the capacitor C1 and the resistor network are configured to determine the frequency of the oscillator. In particular, the oscillator may comprise a second capacitive device and a second inverter. In some embodiments, the second capacitive device is implemented as a second capacitor C2. The second capacitor C2 is connected between the input terminal and the output terminal of the second inverter. The resistor network 220 comprises a plurality of switch-resistor networks connected in series. The capacitors C1, C2 and the plurality of switch-resistor networks are configured to set up the frequency of the oscillator. The detailed structure of the oscillator will be described below with respect to FIGS. 3-6.

Figure 3:
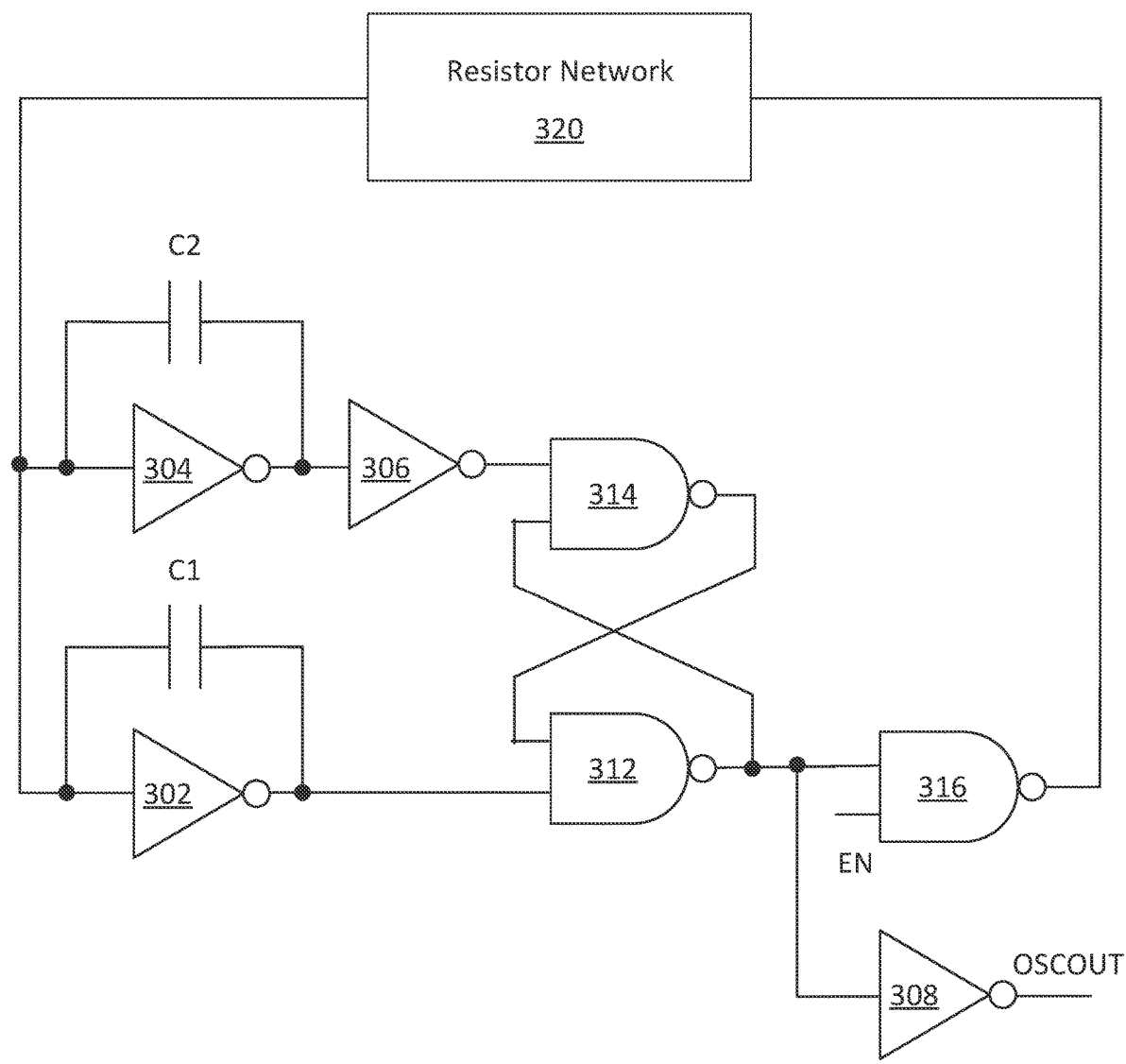
FIG. 3 illustrates a schematic diagram of the oscillator shown in FIG. 2 in accordance with various embodiments of the present disclosure.

FIG. 3 illustrates a schematic diagram of the oscillator shown in FIG. 2 in accordance with various embodiments of the present disclosure. The oscillator comprises a first capacitive device, a first inverter 302, a second capacitive device, a second inverter 304, a third inverter 306, a fourth inverter 308, a first NAND gate 312, a second NAND gate 314, a third NAND gate 316 and a resistor network 320.

In some embodiments, the first capacitive device is implemented as a first capacitor C1. The second capacitive device is implemented as a second capacitor C2 as shown in FIG. 3. The first capacitor C1 is connected between the input terminal and the output terminal of the first inverter 302. The second capacitor C2 is connected between the input terminal and the output terminal of the second inverter 304.

The input terminal of the second inverter 304 is connected to the input terminal of the first inverter 302, and further connected to a first terminal of the resistor network 320. The output terminal of the second inverter 304 is connected to the input terminal of the third inverter 306. The output terminal of the third inverter 306 is connected to a first input terminal of the second NAND gate 314. The output terminal of the first inverter 302 is connected to a second input terminal of the first NAND gate 312. A first input terminal of the first NAND gate 312 is connected to an output terminal of the second NAND gate 314. A second input terminal of the second NAND gate 314 is connected to an output terminal of the first NAND gate 312. The output terminal of the first NAND gate 312 is connected to a first input terminal of the third NAND gate 316. A second input terminal of the third NAND gate 316 is configured to receive an enable signal EN. An output terminal of the third NAND gate 316 is connected to a second terminal of the resistor network 320. The input terminal of the fourth inverter 308 is connected to the output terminal of the first NAND gate 312. The output terminal of the fourth inverter 308 is configured to generate a periodic ac signal.

In operation, the resistor network 320 and the capacitors C1, C2 form a loop. The capacitors C1 and C2 charge and discharge through the resistor network 320, generating an oscillating waveform OSCOUT at the output. The enable signal EN is provided to enable and disable the oscillator. In particular, when the enable signal is at a logical high level, the enable signal allows the oscillator to operate normally. In other words, the oscillator is enabled, and the output signal oscillates at a frequency determined by the resistor network 320 and the capacitors C1, C2. When the enable signal is at a logical low level, the enable signal prevents the charging or discharging of the capacitors, thereby stopping the oscillation. This effectively disables the oscillator.

Figure 4:
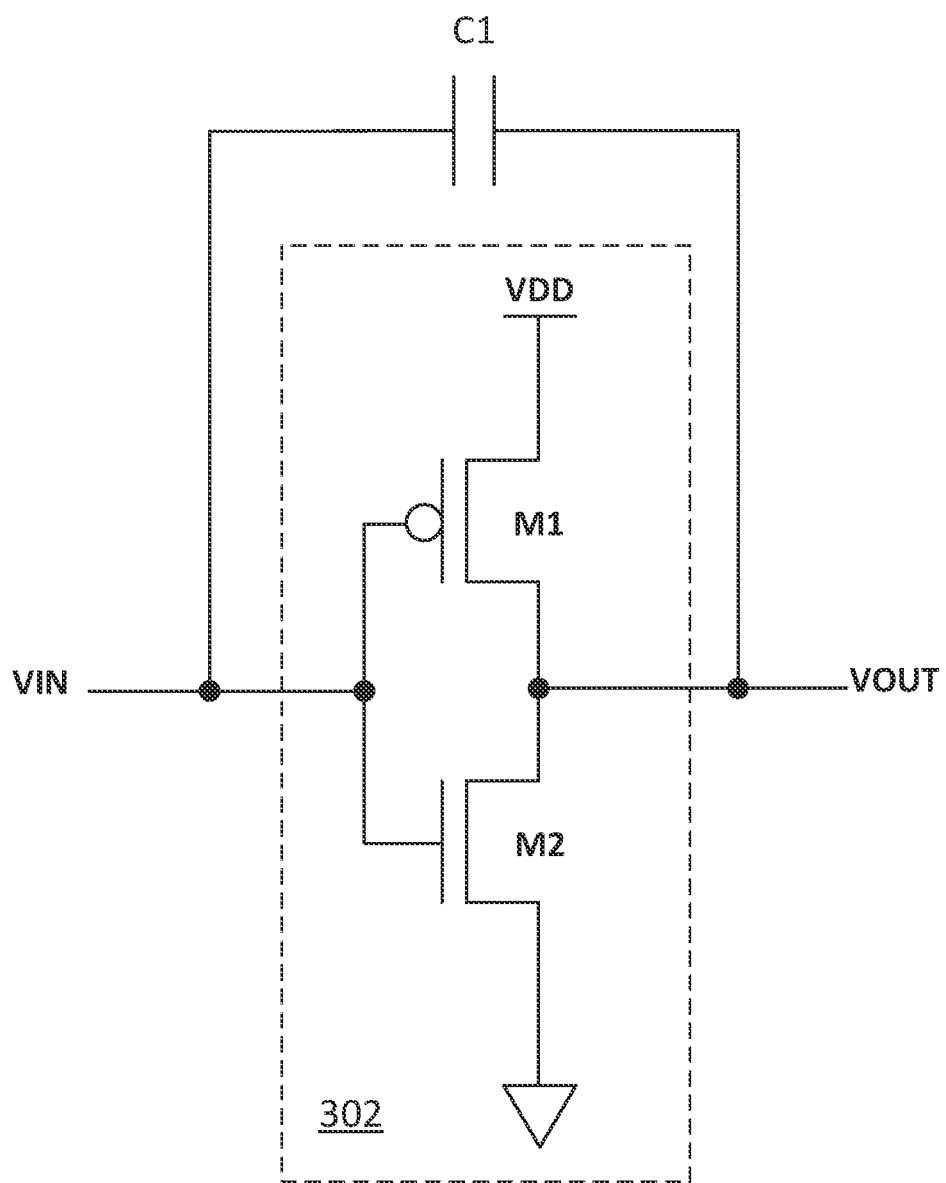
FIG. 4 illustrates a schematic diagram of the inverter shown in FIG. 3 in accordance with various embodiments of the present disclosure.

FIG. 4 illustrates a schematic diagram of the inverter shown in FIG. 3 in accordance with various embodiments of the present disclosure. The inverters shown in FIG. 3 share a common structure. As an example, FIG. 4 illustrates the structure typical of the first inverter 302. The first inverter 302 comprises a p-type transistor M1 and an n-type transistor M2 connected in series between a bias voltage bus VDD and ground. A gate of the p-type transistor M1 and a gate of the n-type transistor M2 are connected together and further connected to the input terminal VIN of the first inverter 302. A drain of the p-type transistor M1 and a drain of the n-type transistor M2 are connected together and further connected to the output terminal VOUT of the first inverter 302. The capacitor C1 is connected between the input terminal VIN and the output terminal VOUT of the first inverter 302.

In operation, the first inverter 302 is configured as a negative amplifier. This negative amplifier is able to enlarge the capacitance at the input node of the first inverter 302. The rationale behind the enlargement of capacitance at the input node of the first inverter can be explained as follows: in operation, VIN is rising. In response to the change of VIN, VOUT, as an output of an inverter, is falling. Since the voltage across the capacitor C1 cannot change instantaneously, the voltage at VIN is falling. More power is used to overcome the force from the negative amplifier, and keep the voltage on VIN to rise. This configuration of the first capacitor C1 and the first inverter 302 increases the effective capacitance at the input node of the first inverter 302. The effective capacitance value of the capacitor on the input node of the negative amplifier can be expressed as:

$$Cin = C1 \times (1 + A) \qquad (4)$$

Referring back to Equation (3), the total capacitance provided by the first capacitor C1 and the negative amplifier is equal to (A+2) times the capacitance of the first capacitor C1.

Figure 5:
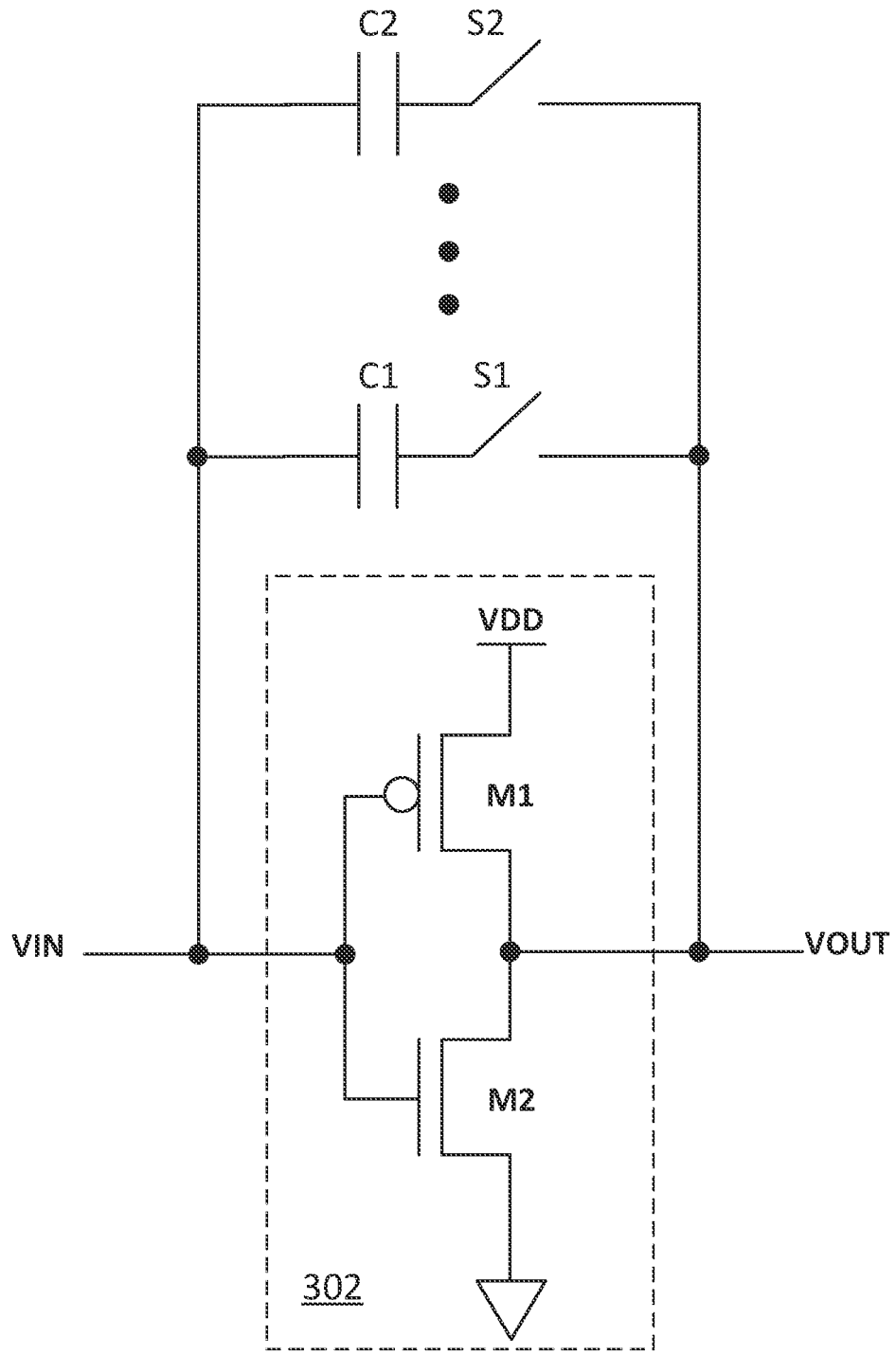
FIG. 5 illustrates a different implementation of the capacitor shown in FIG. 3 in accordance with various embodiments of the present disclosure.

FIG. 5 illustrates a different implementation of the capacitor shown in FIG. 3 in accordance with various embodiments of the present disclosure. The capacitive device shown in FIG. 3 may be replaced by a plurality of switch-capacitor networks (e.g., S1-C1 and S2-C2) connected in parallel. As shown in FIG. 5, each switch-capacitor network comprises a capacitor (e.g., C1) and a switch (e.g., S1) connected in series.

In operation, by turning on a predetermined number of switches of the plurality of switch-capacitor networks, the frequency of the oscillator can be adjusted accordingly.

Figure 6:
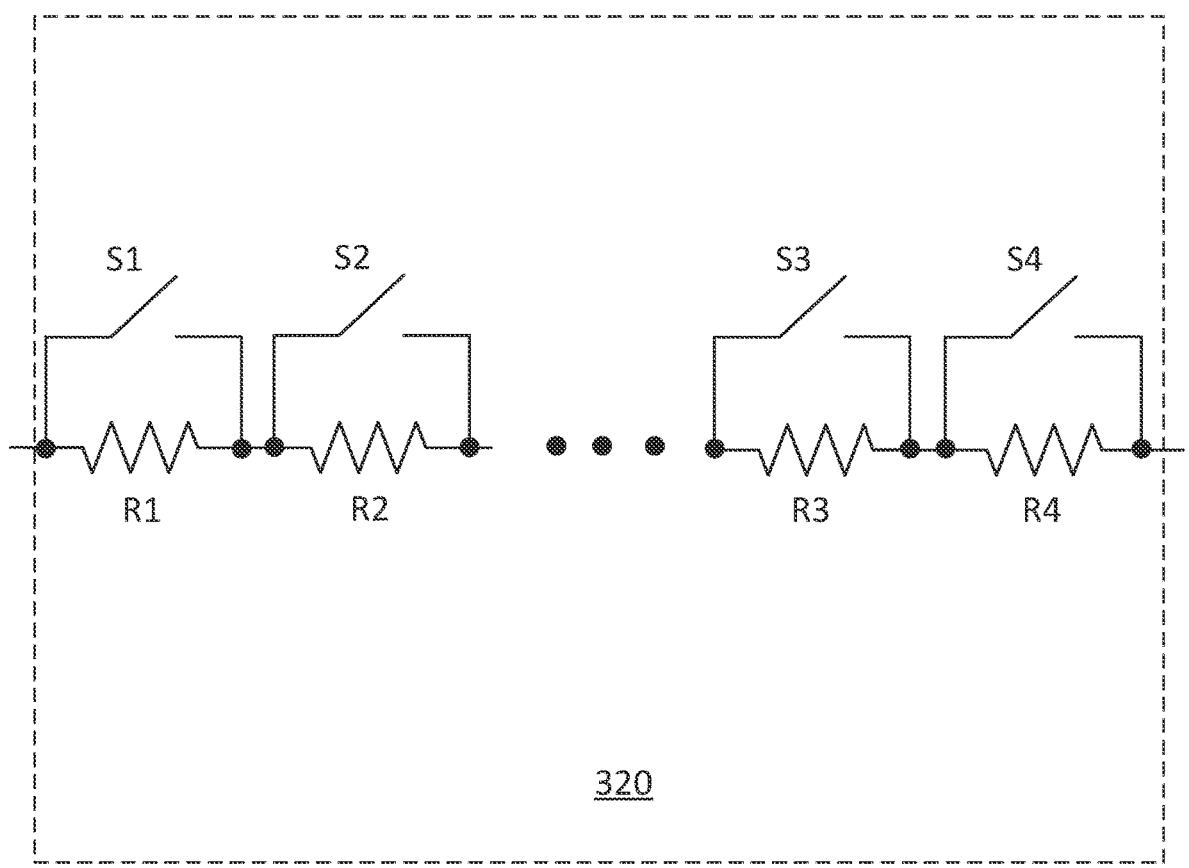
FIG. 6 illustrates a schematic diagram of the resistor network shown in FIG. 3 in accordance with various embodiments of the present disclosure.

FIG. 6 illustrates a schematic diagram of the resistor network shown in FIG. 3 in accordance with various embodiments of the present disclosure. The resistor network 320 comprises a plurality of switch-resistor networks (e.g., S1–R1, S2–R2, S3–R3 and S4–R4) connected in series between the first terminal of the resistor network 320 and the second terminal of the resistor network 320. As shown in FIG. 6, each switch-resistor network comprises a resistor (e.g., R1) and a switch (e.g., S1) connected in parallel.

In operation, by turning on a predetermined number of switches of the plurality of switch-resistor networks, the frequency of the oscillator can be adjusted accordingly.

A resistor-capacitor (RC) ring oscillator is an oscillator circuit that generates a continuous square wave output. An RC ring oscillator comprises an odd number of inverter stages connected in a ring configuration, with each stage comprising an RC network and an inverter. The RC network serves as a delay element, with the capacitor charging and discharging through the resistor, resulting in a time delay. The output of each inverter stage is fed back to the input of the next stage, creating a loop. As the signal propagates through the loop, it undergoes multiple delays, causing the output to oscillate. The frequency of oscillation is determined by the time constant of the RC network and the propagation delay of the inverters.

The advantageous feature of having a capacitor with the increased effective capacitance shown in FIG. 2 is likewise applicable to the RC ring oscillator. FIGS. 7-10 illustrate four different implementations of the RC ring oscillator featuring the increased effective capacitance.

Figure 7:
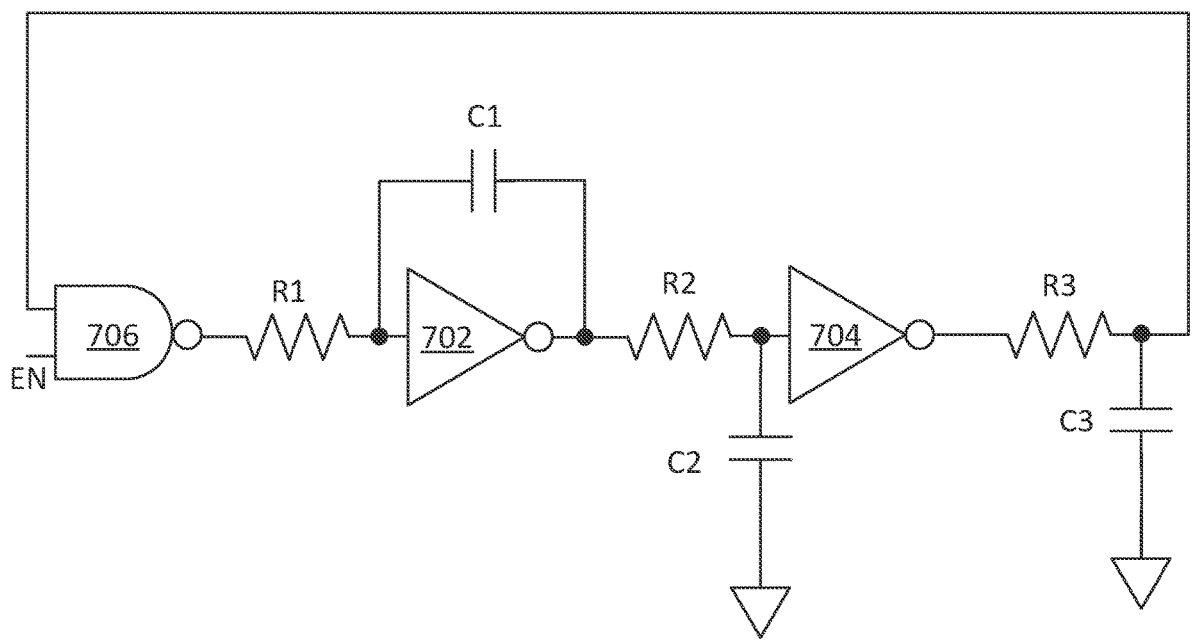
FIG. 7 illustrates a schematic diagram of a first implementation of the RC ring oscillator featuring the increased effective capacitance in accordance with various embodiments of the present disclosure.

FIG. 7 illustrates a schematic diagram of a first implementation of the RC ring oscillator featuring the increased effective capacitance in accordance with various embodiments of the present disclosure. The RC ring oscillator comprises a first inverter 702, a first resistor R1, a first capacitor C1, a second inverter 704, a second resistor R2, a second capacitor C2, a NAND gate 706, a third resistor R3 and a third capacitor C3.

As shown in FIG. 7, the first resistor R1 is connected between an output of the NAND gate 706 and the input terminal of the first inverter 702. The first capacitor C1 is connected between the input terminal and the output terminal of the first inverter 702. The second resistor R2 is connected between the output terminal of the first inverter 702 and the input terminal of the second inverter 704. The second capacitor C2 is connected between the input terminal of the second inverter 704 and ground. The third resistor R3 is connected between the output terminal of the second inverter 704 and a first input terminal of the NAND gate 706. The third capacitor C3 is connected between the first input terminal of the NAND gate 706 and ground. A second input terminal of the NAND gate is configured to receive an enable signal EN.

Referring back to Equation (3), the total capacitance provided by C1 and the first inverter 702 is equal to C1×(2+A). In other words, the effective capacitance is equal to (2+A) times the capacitance of the first capacitor C1. By using the capacitor and inverter configuration shown in FIG. 7, to achieve a large RC time constant, the capacitor size is significantly reduced compared to the conventional RC ring oscillator.

It should be noted that other variations of the capacitive device and the resistor network described above are also applicable to the RC ring oscillator shown in FIG. 7. For example, the resistor (e.g., R1) shown in FIG. 7 may be replaced by a plurality of switch-resistor networks connected in series (e.g., the resistor network shown in FIG. 6). Likewise, the capacitor (e.g., C1) shown in FIG. 7 may be replaced by a plurality of switch-capacitor networks connected in parallel (e.g., the switch-capacitor networks shown in FIG. 5).

Figure 8:
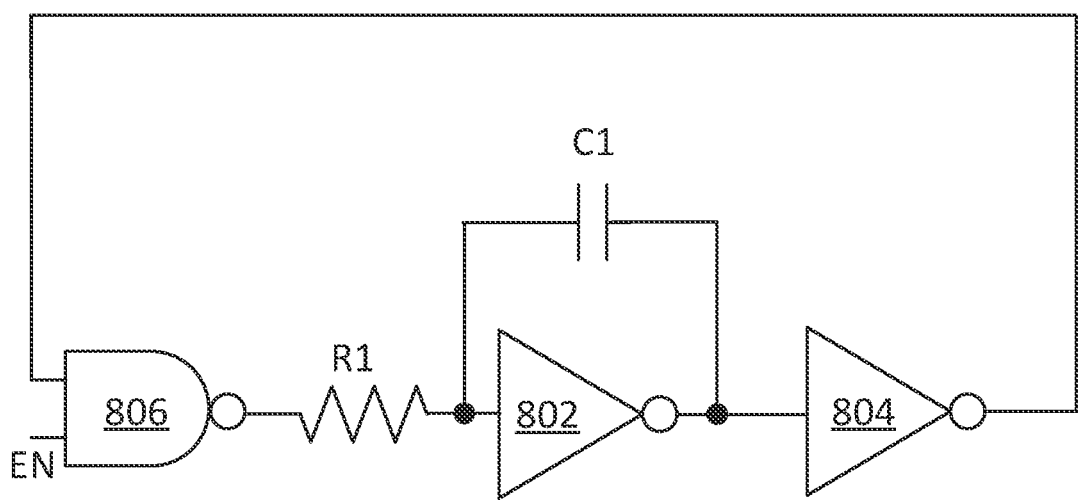
FIG. 8 illustrates a schematic diagram of a second implementation of the RC ring oscillator featuring the increased effective capacitance in accordance with various embodiments of the present disclosure.

FIG. 8 illustrates a schematic diagram of a second implementation of the RC ring oscillator featuring the increased effective capacitance in accordance with various embodiments of the present disclosure. The RC ring oscillator comprises a first inverter 802, a first resistor R1, a first capacitor C1, a second inverter 804 and a NAND gate 806.

As shown in FIG. 8, the first resistor R1 is connected between an output of the NAND gate 806 and the input terminal of the first inverter 802. The first capacitor C1 is connected between the input terminal and the output terminal of the first inverter 802. The input terminal of the second inverter 804 is connected to the output terminal of the first inverter 802. The output terminal of the second inverter 804 is connected to a first input terminal of the NAND gate 806. The second input terminal of the NAND gate 806 is configured to receive an enable signal EN.

Referring back to Equation (3), the total capacitance provided by C1 and the first inverter 802 is equal to C1×(2+A). In other words, the effective capacitance is equal to (2+A) times the capacitance of the first capacitor C1. By using the capacitor and inverter configuration shown in FIG. 8, to achieve a large RC time constant, the capacitor size is significantly reduced compared to the conventional RC ring oscillator.

It should be noted that other variations of the capacitive device and the resistor network described above are also applicable to the RC ring oscillator shown in FIG. 8. For example, the resistor (e.g., R1) shown in FIG. 8 may be replaced by a plurality of switch-resistor networks connected in series (e.g., the resistor network shown in FIG. 6). Likewise, the capacitor (e.g., C1) shown in FIG. 8 may be replaced by a plurality of switch-capacitor networks connected in parallel (e.g., the switch-capacitor networks shown in FIG. 5).

Figure 9:
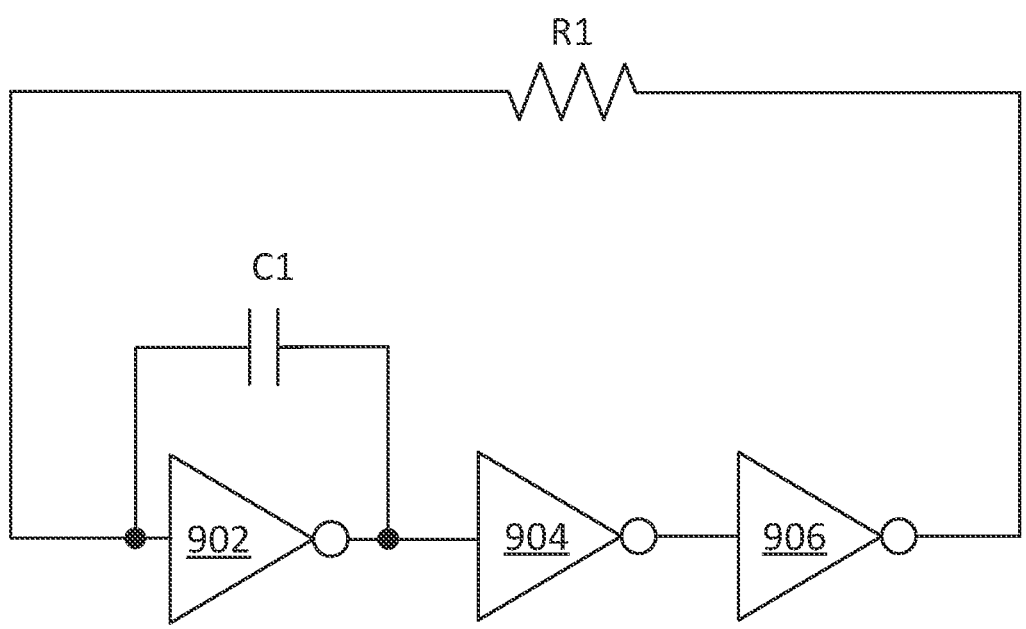
FIG. 9 illustrates a schematic diagram of a third implementation of the RC ring oscillator featuring the increased effective capacitance in accordance with various embodiments of the present disclosure.

FIG. 9 illustrates a schematic diagram of a third implementation of the RC ring oscillator featuring the increased effective capacitance in accordance with various embodiments of the present disclosure. The RC ring oscillator comprises a first inverter 902, a first resistor R1, a first capacitor C1, a second inverter 904 and a third inverter 906.

As shown in FIG. 9, the first capacitor C1 is connected between the input terminal and the output terminal of the first inverter 902. The input terminal of the second inverter 904 is connected to the output terminal of the first inverter 902. The input terminal of the third inverter 906 is connected to the output terminal of the second inverter 904. The first resistor R1 is connected between the output terminal of the third inverter 906 and the input terminal of the first inverter 902.

Referring back to Equation (3), the total capacitance provided by C1 and the first inverter 902 is equal to C1×(2+A). In other words, the effective capacitance is equal to (2+A) times the capacitance of the first capacitor C1. By using the capacitor and inverter configuration shown in FIG. 9, to achieve a large RC time constant, the capacitor size is significantly reduced compared to the conventional RC ring oscillator.

It should be noted that other variations of the capacitive device and the resistor network described above are also applicable to the RC ring oscillator shown in FIG. 9. For example, the resistor (e.g., R1) shown in FIG. 9 may be replaced by a plurality of switch-resistor networks connected in series (e.g., the resistor network shown in FIG. 6). Likewise, the capacitor (e.g., C1) shown in FIG. 9 may be replaced by a plurality of switch-capacitor networks connected in parallel (e.g., the switch-capacitor networks shown in FIG. 5).

Figure 10:
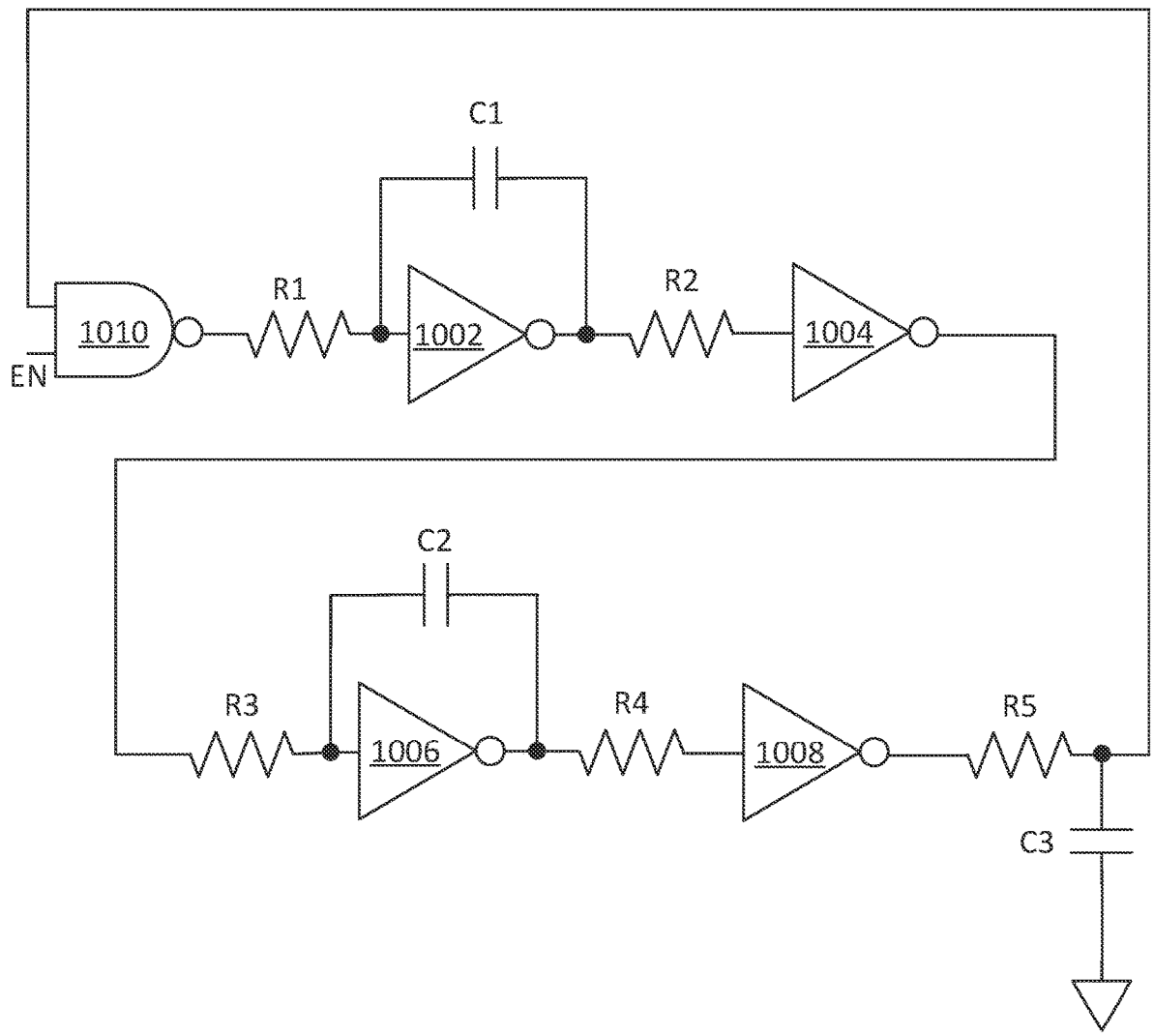
FIG. 10 illustrates a schematic diagram of a fourth implementation of the RC ring oscillator featuring the increased effective capacitance in accordance with various embodiments of the present disclosure.

FIG. 10 illustrates a schematic diagram of a fourth implementation of the RC ring oscillator featuring the increased effective capacitance in accordance with various embodiments of the present disclosure. The RC ring oscillator comprises a first inverter 1002, a first resistor R1, a first capacitor C1, a second inverter 1004, a second resistor R2, a second capacitor C2, a third resistor R3, a third capacitor C3, a third inverter 1006, a fourth resistor R4, a fourth inverter 1008, a fifth resistor R5 and a NAND gate 1010.

As shown in FIG. 10, the first resistor R1 is connected between an output of the NAND gate 1010 and the input terminal of the first inverter 1002. The first capacitor C1 is connected between the input terminal and the output terminal of the first inverter 1002. The second resistor is connected between the output terminal of the first inverter 1002 and the input terminal of the second inverter 1004. The third resistor R3 is connected between the output terminal of the second inverter 1004 and the input terminal of the third inverter 1006. The second capacitor C2 is connected between the input terminal and the output terminal of the second inverter 1006. The fourth resistor R4 is connected between the output terminal of the third inverter 1006 and the input terminal of the fourth inverter 1008. The fifth resistor R5 is connected between the output terminal of the fourth inverter 1008 and a first input of the NAND gate 1010. The third capacitor C3 is connected between the first input of the NAND gate 1010 and ground. A second input terminal of the NAND gate 1010 is configured to receive an enable signal EN.

Referring back to Equation (3), the total capacitance provided by C1 and the first inverter 1002 is equal to C1×(2+A). The effective capacitance of the first capacitor C1 is equal to (2+A) times the capacitance of the first capacitor C1. Likewise, the total capacitance provided by C2 and the third inverter 1006 is equal to C2× (2+A). The effective capacitance of the second capacitor C2 is equal to (2+A) times the capacitance of the second capacitor C2. By using the capacitor and inverter configuration shown in FIG. 10, to achieve a large RC time constant, the capacitor size is significantly reduced compared to the conventional RC ring oscillator.

It should be noted that other variations of the capacitive device and the resistor network described above are also applicable to the RC ring oscillator shown in FIG. 10. For example, the resistor (e.g., R1) shown in FIG. 10 may be replaced by a plurality of switch-resistor networks connected in series (e.g., the resistor network shown in FIG. 6). Likewise, the capacitor (e.g., C1) shown in FIG. 10 may be replaced by a plurality of switch-capacitor networks connected in parallel (e.g., the switch-capacitor networks shown in FIG. 5).

Figure 11:
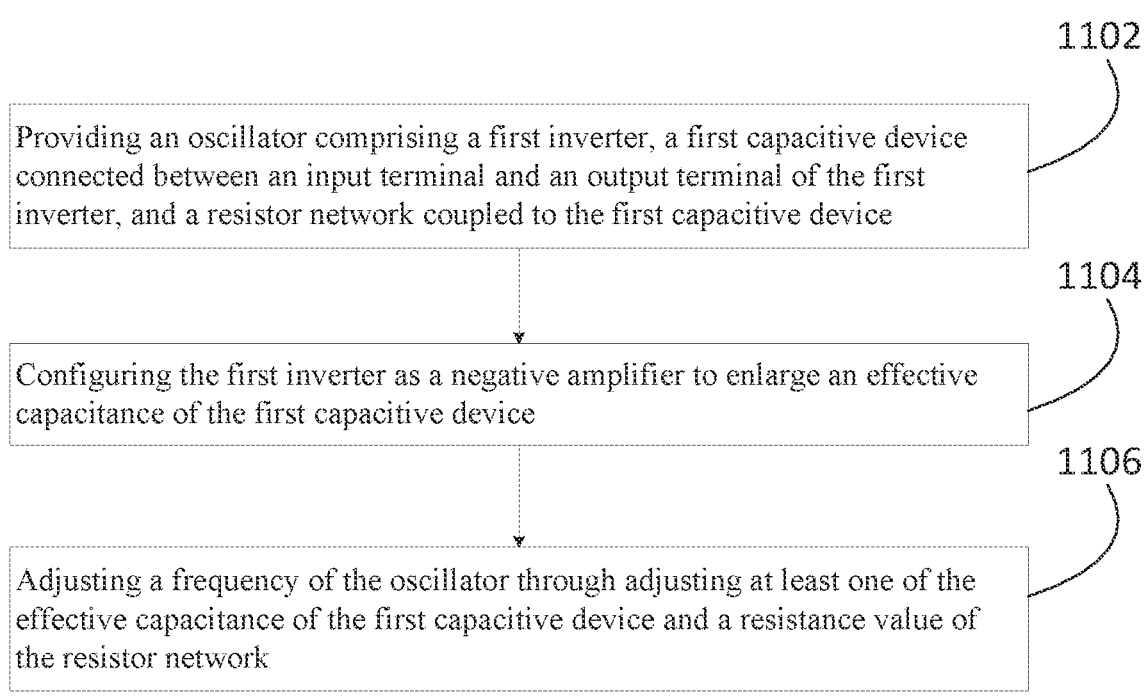
FIG. 11 illustrates a flow chart of a method for controlling the oscillator shown in FIG. 2 in accordance with various embodiments of the present disclosure.

FIG. 11 illustrates a flow chart of a method for controlling the oscillator shown in FIG. 2 in accordance with various embodiments of the present disclosure. This flowchart shown in FIG. 11 is merely an example, which should not unduly limit the scope of the claims. One of ordinary skill in the art would recognize many variations, alternatives, and modifications. For example, various steps illustrated in FIG. 11 may be added, removed, replaced, rearranged and repeated.

At step 1102, an oscillator is provided. The oscillator comprises a first inverter, a first capacitive device connected between an input terminal and an output terminal of the first inverter, and a resistor network coupled to the first capacitive device.

At step 1104, the first inverter is configured as a negative amplifier to enlarge an effective capacitance of the first capacitive device.

At step 1106, a frequency of the oscillator is adjusted through adjusting at least one of the effective capacitance of the first capacitive device and a resistance value of the resistor network.

The effective capacitance of the first capacitive device is equal to (A+2) times a capacitance of the first capacitive device. A is a voltage gain of the negative amplifier.

The oscillator further comprises a second inverter and a second capacitive device connected between an input terminal and an output terminal of the second inverter, and a third inverter, a fourth inverter, a first NAND gate, a second NAND gate and a third NAND gate, and wherein the input terminal of the second inverter is connected to the input terminal of the first inverter, and further connected to a first terminal of the resistor network, the output terminal of the second inverter is connected to an input terminal of the third inverter, an output terminal of the third inverter is connected to a first input terminal of the second NAND gate, the output terminal of the first inverter is connected to a second input terminal of the first NAND gate, a first input terminal of the first NAND gate is connected to an output terminal of the second NAND gate, a second input terminal of the second NAND gate is connected to an output terminal of the first NAND gate, the output terminal of the first NAND gate is connected to a first input terminal of the third NAND gate, a second input terminal of the third NAND gate is configured to receive an enable signal, an output terminal of the third NAND gate is connected to a second terminal of the resistor network, an input terminal of the fourth inverter is connected to the output terminal of the first NAND gate, an output terminal of the fourth inverter is configured to generate a periodic ac signal, and the resistor network comprises a plurality of switch-resistor networks connected in series between the first terminal of the resistor network and the second terminal of the resistor network, and wherein each switch-resistor network comprises a resistor and a switch connected in parallel.

The method further comprises turning on a predetermined number of switches of the plurality of switch-resistor networks so as to determine the frequency of the oscillator.

The first capacitive device comprises a plurality of switch-capacitor networks connected in parallel, and wherein each switch-capacitor network comprises a capacitor and a switch connected in series.

The method further comprises turning on a predetermined number of switches of the plurality of switch-capacitor networks so as to determine the frequency of the oscillator.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
    a first inverter having an input terminal and an output terminal;
    a first capacitive device connected between the input terminal and the output terminal of the first inverter;
    a second inverter having an input terminal and an output terminal;
    a second capacitive device connected between the input terminal and the output terminal of the second inverter; and
    a resistor network connected to the input terminal of the first capacitive device and the input terminal of the second inverter, wherein the first inverter is configured as a negative amplifier, and the first capacitive device and the resistor network are configured to determine a frequency of an oscillator, and wherein the resistor network is connected between the input terminal of the first inverter and a logic gate.

2. The apparatus of claim 1, further comprising:
    a third inverter having an input terminal and an output terminal;
    a fourth inverter having an input terminal and an output terminal; and
    a first NAND gate, a second NAND gate and a third NAND gate, wherein:
        the input terminal of the second inverter is connected to the input terminal of the first inverter, and further connected to a first terminal of the resistor network;
        the output terminal of the second inverter is connected to the input terminal of the third inverter;

the output terminal of the third inverter is connected to a first input terminal of the second NAND gate;
the output terminal of the first inverter is connected to a second input terminal of the first NAND gate;
a first input terminal of the first NAND gate is connected to an output terminal of the second NAND gate;
a second input terminal of the second NAND gate is connected to an output terminal of the first NAND gate;
the output terminal of the first NAND gate is connected to a first input terminal of the third NAND gate;
a second input terminal of the third NAND gate is configured to receive an enable signal;
an output terminal of the third NAND gate is connected to a second terminal of the resistor network;
the input terminal of the fourth inverter is connected to the output terminal of the first NAND gate; and
the output terminal of the fourth inverter is configured to generate a periodic ac signal.

3. The apparatus of claim 2, wherein:
the first capacitive device comprises a first capacitor;
the second capacitive device comprises a second capacitor; and
the resistor network comprises a plurality of switch-resistor networks connected in series between the first terminal of the resistor network and the second terminal of the resistor network, and wherein each switch-resistor network comprises a resistor and a switch connected in parallel.

4. The apparatus of claim 2, wherein:
at least one of the first capacitive device and the second capacitive device comprises a plurality of switch-capacitor networks connected in parallel, and wherein each switch-capacitor network comprises a capacitor and a switch connected in series.

5. The apparatus of claim 1, wherein:
the first inverter comprises a p-type transistor and an n-type transistor connected in series between a bias voltage bus and ground, and wherein:
a gate of the p-type transistor and a gate of the n-type transistor are connected together and further connected to the input terminal of the first inverter; and
a drain of the p-type transistor and a drain of the n-type transistor are connected together and further connected to the output terminal of the first inverter.

6. The apparatus of claim 1, wherein:
the negative amplifier is configured such that an effective capacitance of the first capacitive device is equal to (A+2) times a capacitance of the first capacitive device, and wherein A is a voltage gain of the negative amplifier.

7. A method comprising:
providing an oscillator comprising a first inverter, a first capacitive device connected between an input terminal and an output terminal of the first inverter, a second inverter, a second capacitive device connected between an input terminal and an output terminal of the second inverter, and a resistor network connected to the input terminal of the first inverter and the input terminal of the second inverter, wherein the resistor network is connected between the input terminal of the first inverter and a logic gate;
configuring the first inverter as a negative amplifier to enlarge an effective capacitance of the first capacitive device; and
adjusting a frequency of the oscillator through adjusting at least one of the effective capacitance of the first capacitive device and a resistance value of the resistor network.

8. The method of claim 7, wherein:
the effective capacitance of the first capacitive device is equal to (A+2) times a capacitance of the first capacitive device, and wherein A is a voltage gain of the negative amplifier.

9. The method of claim 7, wherein the oscillator further comprises:
a third inverter, a fourth inverter, a first NAND gate, a second NAND gate and a third NAND gate, and wherein:
the input terminal of the second inverter is connected to the input terminal of the first inverter, and further connected to a first terminal of the resistor network;
the output terminal of the second inverter is connected to an input terminal of the third inverter;
an output terminal of the third inverter is connected to a first input terminal of the second NAND gate;
the output terminal of the first inverter is connected to a second input terminal of the first NAND gate;
a first input terminal of the first NAND gate is connected to an output terminal of the second NAND gate;
a second input terminal of the second NAND gate is connected to an output terminal of the first NAND gate;
the output terminal of the first NAND gate is connected to a first input terminal of the third NAND gate;
a second input terminal of the third NAND gate is configured to receive an enable signal;
an output terminal of the third NAND gate is connected to a second terminal of the resistor network;
an input terminal of the fourth inverter is connected to the output terminal of the first NAND gate;
an output terminal of the fourth inverter is configured to generate a periodic ac signal; and
the resistor network comprises a plurality of switch-resistor networks connected in series between the first terminal of the resistor network and the second terminal of the resistor network, and wherein each switch-resistor network comprises a resistor and a switch connected in parallel.

10. The method of claim 9, further comprising:
turning on a predetermined number of switches of the plurality of switch-resistor networks so as to determine the frequency of the oscillator.

11. The method of claim 7, wherein:
the first capacitive device comprises a plurality of switch-capacitor networks connected in parallel, and wherein each switch-capacitor network comprises a capacitor and a switch connected in series.

12. The method of claim 11, further comprising:
turning on a predetermined number of switches of the plurality of switch-capacitor networks so as to determine the frequency of the oscillator.

13. A system comprising:
a first inverter having an input terminal and an output terminal;
a first capacitive device connected between the input terminal and the output terminal of the first inverter;
a second inverter having an input terminal and an output terminal;

a second capacitive device connected between the input terminal and the output terminal of the second inverter; and a resistor network connected to the input terminal of the first inverter and the input terminal of the second inverter, wherein the first capacitive device, the second capacitive device and the resistor network are configured to determine a frequency of an oscillator, and wherein the resistor network is connected between the input terminal of the first inverter and a logic gate.

14. The system of claim 13, further comprising:
a third inverter having an input terminal and an output terminal;
a fourth inverter having an input terminal and an output terminal; and
a first NAND gate, a second NAND gate and a third NAND gate, wherein:
the output terminal of the second inverter is connected to the input terminal of the third inverter;
the output terminal of the third inverter is connected to a first input terminal of the second NAND gate;
the output terminal of the first inverter is connected to a second input terminal of the first NAND gate;
a first input terminal of the first NAND gate is connected to an output terminal of the second NAND gate;
a second input terminal of the second NAND gate is connected to an output terminal of the first NAND gate;
the output terminal of the first NAND gate is connected to a first input terminal of the third NAND gate;
a second input terminal of the third NAND gate is configured to receive an enable signal;
an output terminal of the third NAND gate is connected to the resistor network;
the input terminal of the fourth inverter is connected to the output terminal of the first NAND gate; and
the output terminal of the fourth inverter is configured to generate a periodic ac signal.

15. The system of claim 13, wherein:
the first capacitive device comprises a first capacitor; and
the second capacitive device comprises a second capacitor.

16. The system of claim 13, wherein:
the resistor network comprises a plurality of switch-resistor networks connected in series between the first terminal of the resistor network and the second terminal of the resistor network, and wherein each switch-resistor network comprises a resistor and a switch connected in parallel.

* * * * *